United States Patent
Mohammed

(10) Patent No.: US 11,664,338 B2
(45) Date of Patent: May 30, 2023

(54) STRETCHABLE AND SELF-HEALING SOLDERS FOR DIES AND COMPONENTS IN MANUFACTURING ENVIRONMENTS

(71) Applicant: Anwar A. Mohammed, San Jose, CA (US)

(72) Inventor: Anwar A. Mohammed, San Jose, CA (US)

(*) Notice: Subject to any disclaimer, the term of this patent is extended or adjusted under 35 U.S.C. 154(b) by 0 days.

(21) Appl. No.: 16/529,333

(22) Filed: Aug. 1, 2019

(65) Prior Publication Data

US 2020/0043880 A1 Feb. 6, 2020

Related U.S. Application Data

(60) Provisional application No. 62/714,069, filed on Aug. 2, 2018.

(51) Int. Cl.
*H01L 23/00* (2006.01)
*H01L 21/48* (2006.01)
*H01L 23/498* (2006.01)

(52) U.S. Cl.
CPC .......... *H01L 24/17* (2013.01); *H01L 21/4853* (2013.01); *H01L 23/49816* (2013.01); *H01L 24/11* (2013.01); *H01L 24/742* (2013.01); H01L 2224/175 (2013.01); H01L 2924/3512 (2013.01)

(58) Field of Classification Search
CPC ............... H01L 24/17; H01L 23/49816; H01L 21/4853; H01L 24/742; H01L 24/11; H01L 2924/3512; H01L 2224/175

USPC .................. 257/737, 738; 438/613
See application file for complete search history.

(56) References Cited

U.S. PATENT DOCUMENTS

2003/0215981 A1* 11/2003 Strouse et al. .......... H01L 21/44 438/118
2014/0299231 A1* 10/2014 Chu et al. .......... B23K 35/0222 148/23

OTHER PUBLICATIONS

Wang X P, Guo J R, Hu L., Preparation and Application of gallium-based conductive materials in the very recent years. Sci China Tech Sci, 2020, 63, https://doi.org/10.1007/s11431-020-1733-x. 16 pages.

Musgrave, C., Lu, N., Sato, R., & Nagai, K. (May 7, 2019). Gallium-Tin Alloys as a low melting point liquid metal for repetition-pulse-laser-induced high energy density state toward compact pulse EUV Sources. Retrieved from https://pubs.rsc.org/en/content/articlelanding/2019/ra/c9ra01905g. 6 pages.

* cited by examiner

*Primary Examiner* — Thinh T Nguyen
(74) *Attorney, Agent, or Firm* — Jaffery Watson Mendonsa & Hamilton LLP

(57) ABSTRACT

A mechanism is described for facilitating stretchable and self-healing solders in microelectronics manufacturing environments. An apparatus of embodiments, as described herein, includes one or more solders associated with a microelectronics component, where the one or more solders contain a liquid metal and are wrapped in an encapsulation material. The apparatus further includes a substrate coupled to the one or more solders.

5 Claims, 5 Drawing Sheets

US 11,664,338 B2

STRETCHABLE AND SELF-HEALING SOLDERS FOR DIES AND COMPONENTS IN MANUFACTURING ENVIRONMENTS

CLAIM OF PRIORITY

This application claims the benefit of and priority to U.S. Provisional Patent Application No. 62/714,069, by Dr. Anwar A. Mohammed, filed Aug. 2, 2018, entitled EFFICIENT OVERCOMING OF DIE AND DIE ATTACHED FAILURES CAUSED BY THERMAL AND MECHANICAL STRESSING, the entire contents of which are incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD

Embodiments described herein generally relate to devices. More particularly, embodiments relate to facilitating stretchable and self-healing solders for dies and components in manufacturing environment.

BACKGROUND

It is common for solders and attached components to fail due to solder cracking, which is often because of the coefficient of thermal expansion (CTE) difference between the chip material and the substrate material. Such failures often limit the maximum usable size of a chip and necessitate the requirement for CTE compatibility between the chip and substrate materials, which, in turn, increases manufacturing costs.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

In the following description, numerous specific details are set forth. However, embodiments, as described herein, may be practiced without these specific details. In other instances, well-known circuits, structures and techniques have not been shown in detail in order not to obscure the understanding of this description.

Embodiments provide for a novel technique for overcoming the serious challenges associated with CTE incompatibility through novel soldering techniques that use stretchable and self-healing solders that leverage liquid metals and epoxy encapsulants that shield and protect stretchable solders.

It is contemplated that embodiments are not limited to any number or types of processes, materials, apparatus, or techniques for achieving the novel soldering techniques in electronics and semiconductor manufacturing environments.

Throughout this document, terms like "logic", "component", "module", "framework", "engine", "mechanism", "technique", and/or the like, may be referenced interchangeably and include, by way of example, software, hardware, and/or any combination of software and hardware, such as firmware. Further, any use of a particular brand, word, term, phrase, name, acronym, or the like, such as "stretchable", "self-healing", "solders", "soldering technique", "die", "electronics", "semiconductor", "CTE", "user", "material", "wireless", "computing device", "smartphone", "tablet computer", "software application", "social and/or business networking applications or websites", "website", or "site", and/or the like, should not be read to limit embodiments to software or devices that carry that label in products or in literature external to this document.

Figure 1:
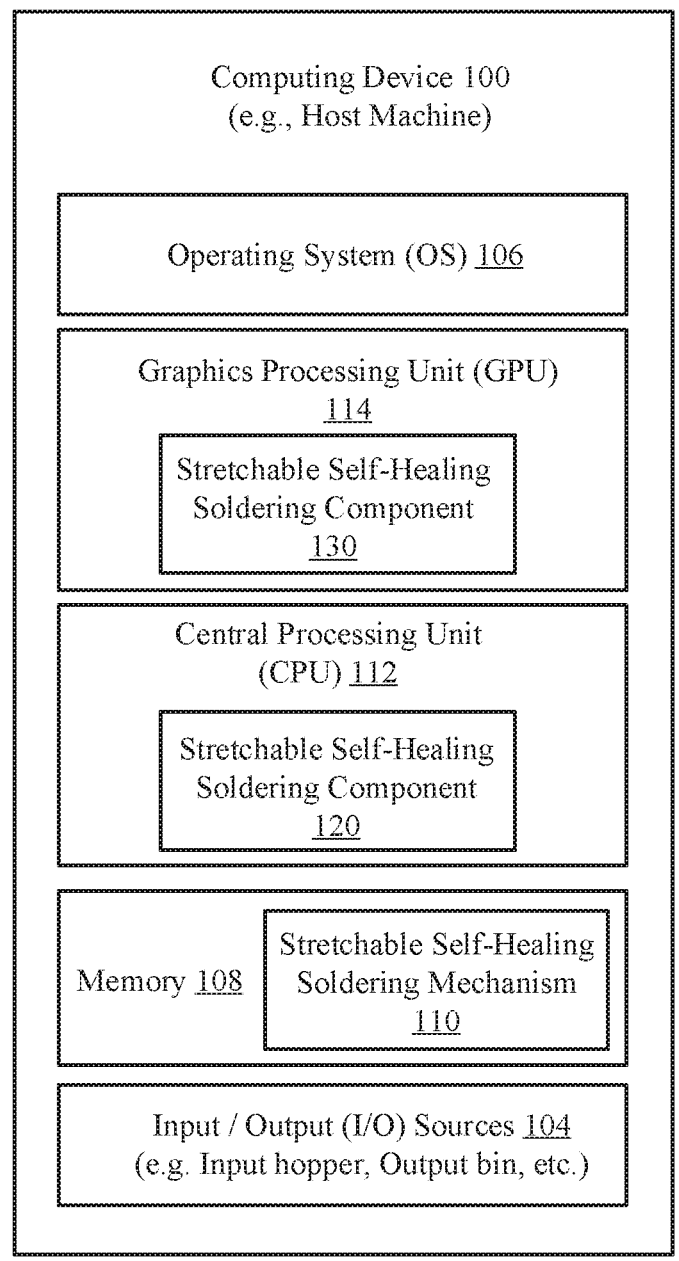
FIG. 1 a computing device hosting stretchable and self-healing soldering mechanism according to one embodiment.

FIG. 1 illustrates a computing device 100 hosting soldering mechanism 110 according to one embodiment. Computing or processing device (also referred to as "host machine", "host system", or "host device") 100 represents a communication and data processing device for hosting one or more mechanisms and/or one or more components for facilitating stretchable and self-healing soldering techniques for dies and attached components in electronics and semiconductor manufacturing environments. For example, computing device 100 hosts stretchable self-healing soldering mechanism ("soldering mechanism") 110 and/or one or more of stretchable self-healing soldering components ("soldering components) 120, 130 to facilitate a stretchable self-healing solder ("novel solder" or simply "solder"), such as novel solder 205 to function within a soldering apparatus or system ("soldering system" or "soldering apparatus"), such as soldering system 200 FIG. 2, to be stretchable and self-healing and perform the novels tasks within a microelectronic and/or semiconductor manufacturing environment, as will be further described within this document.

Computing device 100 represents a communication and data processing device for facilitating or performing controlled cavitation with respect to cosmetics, drugs, etc. It is contemplated and as will be further discussed later in this document, computing device 100 may include any number and type of other parts or components, such as hopper, belt, shaker, etc., necessitated for performing controlled cavitation.

Further, computing device 100 may include or coupled to or be associated with or facilitate by one or more of (but not limited to) smart voice command devices, intelligent personal assistants, home/office automation system, home appliances (e.g., washing machines, television sets, etc.), mobile devices (e.g., smartphones, tablet computers, etc.), gaming devices, handheld devices, wearable devices (e.g., smartwatches, smart bracelets, etc.), virtual reality (VR) devices, head-mounted displays (HMDs), Internet of Things (IoT) devices, laptop computers, desktop computers, server computers, set-top boxes (e.g., Internet-based cable television set-top boxes, etc.), global positioning system (GPS)-based devices, automotive infotainment devices, etc.

Further, computing device 100 may include or coupled to or be associated with or facilitate by one or more of any number and type of other smart devices, such as (but not limited to) autonomous machines or artificially intelligent agents, such as a mechanical agents or machines, electronics agents or machines, virtual agents or machines, electro-mechanical agents or machines, etc. Examples of autonomous machines or artificially intelligent agents may include (without limitation) robots, autonomous vehicles (e.g., self-driving cars, self-flying planes, self-sailing boats, etc.), autonomous equipment (self-operating construction vehicles, self-operating medical equipment, etc.), and/or the like. Further, "autonomous vehicles" are not limited to automobiles but that they may include any number and type of autonomous machines, such as robots, autonomous equipment, household autonomous devices, and/or the like, and any one or more tasks or operations relating to such autonomous machines may be interchangeably referenced with autonomous driving.

Further, for example, computing device 100 may include a computer platform hosting an integrated circuit ("IC"), such as a system on a chip ("SoC" or "SOC"), integrating various hardware and/or software components of computing device 100 on a single chip. For example, computing device 100 comprises a data processing device having one or more processors including (but not limited to) central processing unit 112 and graphics processing unit 114 that are co-located on a common semiconductor package.

As illustrated, in one embodiment, computing device 100 may include any number and type of hardware and/or software components, such as (without limitation) graphics processing unit ("GPU" or simply "graphics processor") 114, graphics driver (also referred to as "GPU driver", "graphics driver logic", "driver logic", user-mode driver (UMD), UMD, user-mode driver framework (UMDF), UMDF, or simply "driver") 116, central processing unit ("CPU" or simply "application processor") 112, memory 104, network devices, drivers, and/or the like, as well as input/output (I/O) source(s) 108, such as touchscreens, touch panels, touch pads, virtual or regular keyboards, virtual or regular mice, ports, connectors, etc. Computing device 100 may include operating system (OS) 106 serving as an interface between hardware and/or physical resources of the computing device 100 and a user.

It is to be appreciated that a lesser or more equipped system than the example described above may be preferred for certain implementations. Therefore, any configuration of computing device 100 may vary from implementation to implementation depending upon numerous factors, such as price constraints, performance requirements, technological improvements, or other circumstances.

Embodiments may be implemented as any or a combination of: one or more microchips or integrated circuits interconnected using a parentboard, hardwired logic, software stored by a memory device and executed by a microprocessor, firmware, an application specific integrated circuit (ASIC), and/or a field programmable gate array (FPGA). Terms like "logic", "module", "component", "engine", "circuitry", "element", and "mechanism" may include, by way of example, software, hardware, firmware, and/or a combination thereof.

In one embodiment, as illustrated, soldering mechanism 110 may be hosted by memory 108 in communication with I/O source(s) 104, such as microphones, speakers, etc., of computing device 100. In another embodiment, soldering mechanism 110 may be part of or hosted by operating system 106. In yet another embodiment, soldering mechanism 110 may be hosted or facilitated by graphics driver 116. In yet another embodiment, soldering mechanism 110 may be hosted by or embedded in central processing unit ("CPU" or simply "application processor") 112 and/or graphics processing unit ("GPU" or simply graphics processor") 114 as one or more hardware components, such as soldering component 120 at application processor 112, and/or soldering component 130 at graphics processor 114.

For example, soldering components 120, 130 may be implemented as or using one or more analog or digital circuits, logic circuits, programmable processors, programmable controllers, GPUs, digital signal processors (DSPs), application specific integrated circuits (ASICs), programmable logic devices (PLDs), field programmable logic devices (FPLDs), and/or the like. It is, therefore, contemplated that one or more portions or components of soldering mechanism 110 may be employed or implemented as hardware, software, firmware, or any combination thereof.

In some embodiments, computing device 100 includes a smart material handling component ("material component") representing a hardware or firmware component hosted by one or more of application and graphics processors 112, 114. As will be further discussed in this document, in one embodiment, material component is facilitated by soldering mechanism 110 to perform one or more novels tasks as described throughout this document.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events Computing device 100 may host network interface device(s) to provide access to a network, such as a LAN, a wide area network (WAN), a metropolitan area network (MAN), a personal area network (PAN), Bluetooth, a cloud network, a mobile network (e.g., $3^{rd}$ Generation (3G), $4^{th}$ Generation (4G), etc.), an intranet, the Internet, etc. Network interface(s) may include, for example, a wireless network interface having antenna, which may represent one or more antenna(e). Network interface(s) may also include, for example, a wired network interface to communicate with remote devices via network cable, which may be, for example, an Ethernet cable, a coaxial cable, a fiber optic cable, a serial cable, or a parallel cable.

Embodiments may be provided, for example, as a computer program product which may include one or more machine-readable media having stored thereon machine-executable instructions that, when executed by one or more machines such as a computer, a data processing machine, a data processing device, network of computers, or other electronic devices, may result in the one or more machines carrying out operations in accordance with embodiments described herein. As further described with reference to processing architecture 500 of FIG. 5, a machine may include one or more processors, such as a CPU, a GPU, etc. A machine-readable medium may include, but is not limited to, floppy diskettes, optical disks, Compact Disc-Read Only Memories (CD-ROMs), magneto-optical disks, ROMs, Random Access Memories (RAMs), Erasable Programmable Read Only Memories (EPROMs), Electrically Erasable Programmable Read Only Memories (EEPROMs), magnetic or optical cards, flash memory, or other type of media/machine-readable medium suitable for storing machine-executable instructions.

For example, when reading any of the apparatus, method, or system claims of this patent to cover a purely software and/or firmware implementation, instructions associated with soldering mechanism 110 may be expressly stored at a non-transitory computer readable storage device or storage disk such as a memory, a digital versatile disk (DVD), a compact disk (CD), a Blu-ray disk, etc., including the software and/or firmware.

Moreover, one or more elements of soldering mechanism 110 may be downloaded as a computer program product, wherein the program may be transferred from a remote computer (e.g., a server) to a requesting computer (e.g., a client) by way of one or more data signals embodied in and/or modulated by a carrier wave or other propagation medium via a communication link (e.g., a modem and/or network connection).

Throughout this document, the term "user" may be interchangeably referred to as "viewer", "observer", "speaker", "person", "individual", "end-user", "developer", "programmer", "administrators", and/or the like. For example, in some cases, a user may refer to an end-user, such as a consumer accessing a client computing device, while, in some other cases, a user may include a developer, a programmer, a system administrator, etc., accessing a workstation serving as a client computing device. It is to be noted that throughout this document, terms like "graphics domain" may be referenced interchangeably with "graphics processing unit", "graphics processor", or simply "GPU"; similarly, "CPU domain" or "host domain" may be referenced interchangeably with "computer processing unit", "application processor", or simply "CPU".

It is to be noted that terms like "node", "computing node", "server", "server device", "cloud computer", "cloud server", "cloud server computer", "machine", "host machine", "device", "computing device", "computer", "computing system", and the like, may be used interchangeably throughout this document. It is to be further noted that terms like "application", "software application", "program", "software program", "package", "software package", and the like, may be used interchangeably throughout this document.

Further, throughout this document, terms like "request", "query", "job", "work", "work item", and "workload" are referenced interchangeably. Similarly, an "application" or "agent" may refer to or include a computer program, a software application, a game, a workstation application, etc., offered through an application programming interface (API), such as a free rendering API, such as Open Graphics Library (OpenGL®), DirectX® 11, DirectX® 12, etc., where "dispatch" may be interchangeably referenced as "work unit" or "draw", while "application" may be interchangeably referred to as "workflow" or simply "agent".

In some embodiments, terms like "display screen" and "display surface" may be used interchangeably referring to the visible portion of a display device while the rest of the display device may be embedded into a computing device, such as a smartphone, a wearable device, etc. It is contemplated and to be noted that embodiments are not limited to any particular computing device, software application, hardware component, display device, display screen or surface, protocol, standard, etc. For example, embodiments may be applied to and used with any number and type of real-time applications on any number and type of computers, such as desktops, laptops, tablet computers, smartphones, head-mounted displays and other wearable devices, and/or the like. Further, for example, rendering scenarios for efficient performance using this novel technique may range from simple scenarios, such as desktop compositing, to complex scenarios, such as three-dimensional (3D) games, augmented reality applications, etc.

Figure 2:
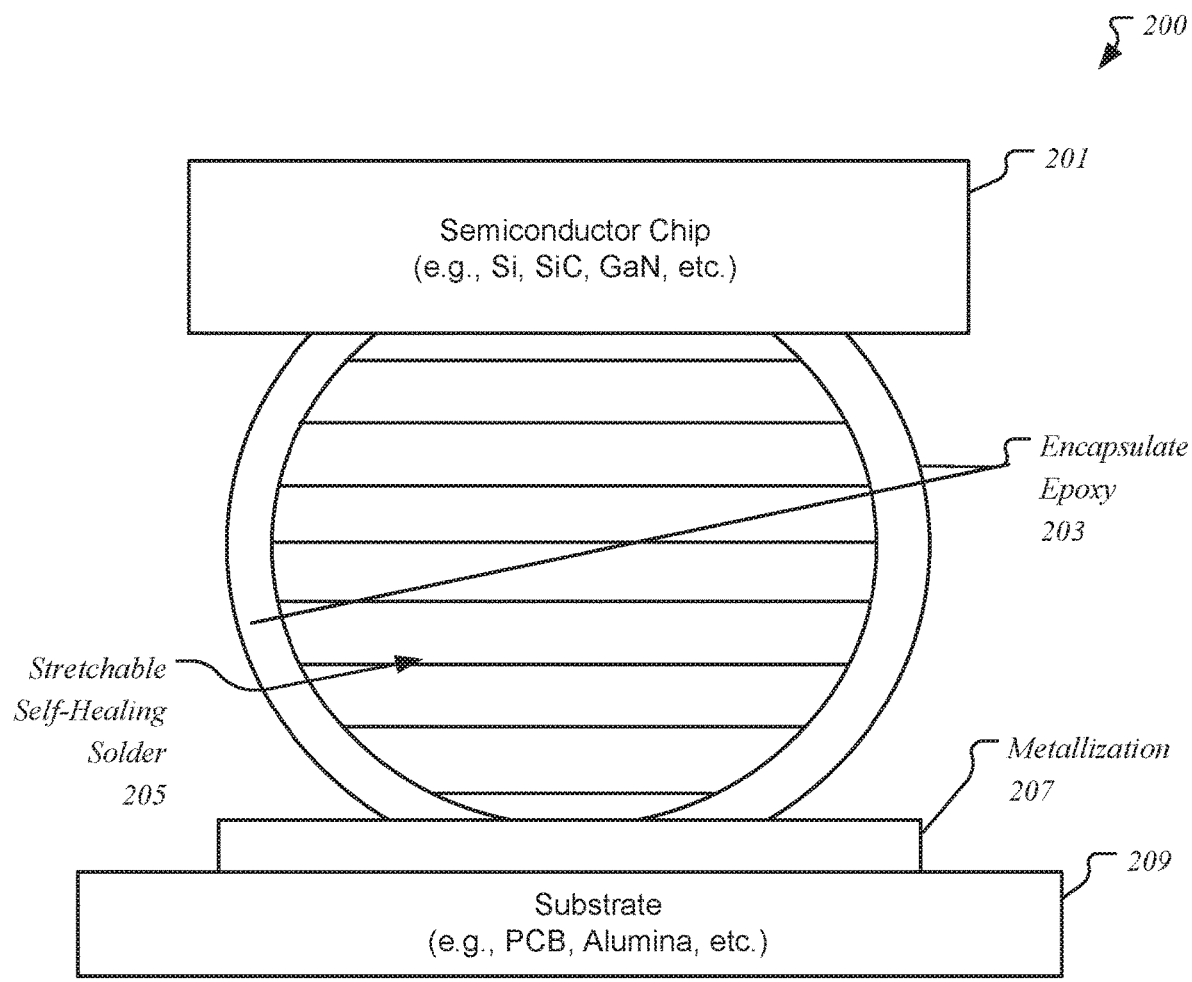
FIG. 2 illustrates a stretchable and self-healing soldering system according to one embodiment.

Computing device 100 may employ communication/compatibility logic may be used to facilitate the needed or desired communication and compatibility between any number of devices to facilitate employing and using of stretchable and self-healing solders, such as solder 205 of FIG. 2. Some of the devices may include client or server computing devices, other medicines and/or cosmetics manufacturing apparatus, input/output devices (e.g., cameras, sensors, detectors, microphones, speakers, display devices, etc.), databases, networks, etc.

Communication/compatibility logic may be used to facilitate dynamic communication and compatibility between various components, networks, database(s), and/or communication medium(s), etc., and any number and type of other computing devices (such as wearable computing devices, mobile computing devices, desktop computers, server computing devices, etc.), processing devices (e.g., central processing unit (CPU), graphics processing unit (GPU), etc.), capturing/sensing components (e.g., non-visual data sensors/detectors, such as audio sensors, olfactory sensors, haptic sensors, signal sensors, vibration sensors, chemicals detectors, radio wave detectors, force sensors, weather/temperature sensors, body/biometric sensors, scanners, etc., and visual data sensors/detectors, such as cameras, etc.), user/context-awareness components and/or identification/verification sensors/devices (such as biometric sensors/detectors, scanners, etc.), memory or storage devices, data sources, and/or database(s) (such as data storage devices, hard drives, solid-state drives, hard disks, memory cards or devices, memory circuits, etc.), network(s) (e.g., Cloud network, Internet, Internet of Things, intranet, cellular network, proximity networks, such as Bluetooth, Bluetooth low energy (BLE), Bluetooth Smart, Wi-Fi proximity, Radio Frequency Identification, Near Field Communication, Body Area Network, etc.), wireless or wired communications and relevant protocols (e.g., Wi-Fi®, WiMAX, Ethernet, etc.), connectivity and location management techniques, software applications/websites, (e.g., social and/or business networking websites, business applications, games and other entertainment applications, etc.), programming languages, etc., while ensuring compatibility with changing technologies, parameters, protocols, standards, etc.

Computing device 100 may further provide a user interface (e.g., graphical user interface (GUI)-based user interface, Web browser, cloud-based platform user interface, software application-based user interface, other user or application programming interfaces (APIs), etc.) as facilitated by interface logic. Computing device 100 may further include I/O source(s) having input component(s), such as camera(s), microphone(s), sensors, detectors, keyboards, mice, etc., and output component(s), such as display device(s) or simply display(s) (e.g., integral displays, tensor displays, projection screens, display screens, etc.), speaker devices(s) or simply speaker(s), etc.

Computing device 100 is further illustrated as having access to and/or being in communication with one or more database(s) and/or one or more of other computing or printing devices over one or more communication medium(s) (e.g., networks such as a proximity network, a cloud network, an intranet, the Internet, etc.).

In some embodiments, database(s) may include one or more of storage mediums or devices, repositories, data sources, etc., having any amount and type of information, such as data, metadata, etc., relating to any number and type of applications, such as data and/or metadata relating to one or more users, physical locations or areas, applicable laws, policies and/or regulations, user preferences and/or profiles, security and/or authentication data, historical and/or preferred details, and/or the like.

As aforementioned, terms like "logic", "module", "component", "engine", "circuitry", "element", and "mechanism" may include, by way of example, software, hardware, firmware, and/or any combination thereof.

I/O source(s) 104 may include any number or type of microphone(s), camera(s), speaker(s), display(s), etc., for capture or presentation of data. For example, one or more of microphone(s) may be used to detect speech or sound simultaneously from users, such as speakers. Similarly, one or more of camera(s) may be used to capture images or videos of a geographic location (whether that be indoors or outdoors) and its associated contents (e.g., furniture, electronic devices, humans, animals, trees, mountains, etc.) and form a set of images or video streams.

Similarly, as illustrated, output component(s) may include any number and type of speaker(s) or speaker device(s) to serve as output devices for outputting or giving out audio from computing device 100 for any number or type of reasons, such as human hearing or consumption. For example, speaker(s) work the opposite of microphone(s) where speaker(s) convert electric signals into sound.

Moreover, input component(s) may include any number or type of cameras, such as depth-sensing cameras or capturing devices that are known for capturing still and/or video red-green-blue (RGB) and/or RGB-depth (RGB-D) images for media, such as personal media. Such images, having depth information, have been effectively used for various computer vision and computational photography effects, such as (without limitations) scene understanding, refocusing, composition, cinema-graphs, etc. Similarly, for example, displays may include any number and type of displays, such as integral displays, tensor displays, stereoscopic displays, etc., including (but not limited to) embedded or connected display screens, display devices, projectors, etc.

Input component(s) may further include one or more of vibration components, tactile components, conductance elements, biometric sensors, chemical detectors, signal detectors, electroencephalography, functional near-infrared spectroscopy, wave detectors, force sensors (e.g., accelerometers), illuminators, eye-tracking or gaze-tracking system, head-tracking system, etc., that may be used for capturing any amount and type of visual data, such as images (e.g., photos, videos, movies, audio/video streams, etc.), and non-visual data, such as audio streams or signals (e.g., sound, noise, vibration, ultrasound, etc.), radio waves (e.g., wireless signals, such as wireless signals having data, metadata, signs, etc.), chemical changes or properties (e.g., humidity, body temperature, etc.), biometric readings (e.g., figure prints, etc.), brainwaves, brain circulation, environmental/weather conditions, maps, etc. It is contemplated that "sensor" and "detector" may be referenced interchangeably throughout this document. It is further contemplated that one or more input component(s) may further include one or more of supporting or supplemental devices for capturing and/or sensing of data, such as illuminators (e.g., IR illuminator), light fixtures, generators, sound blockers, etc.

It is further contemplated that in one embodiment, input component(s) may include any number and type of context sensors (e.g., linear accelerometer) for sensing or detecting any number and type of contexts (e.g., estimating horizon, linear acceleration, etc., relating to a mobile computing device, etc.). For example, input component(s) may include any number and type of sensors, such as (without limitations): accelerometers (e.g., linear accelerometer to measure linear acceleration, etc.); inertial devices (e.g., inertial accelerometers, inertial gyroscopes, micro-electro-mechanical systems (MEMS) gyroscopes, inertial navigators, etc.); and gravity gradiometers to study and measure variations in gravitation acceleration due to gravity, etc.

Similarly, output component(s) may include dynamic tactile touch screens having tactile effectors as an example of presenting visualization of touch, where an embodiment of such may be ultrasonic generators that can send signals in space which, when reaching, for example, human fingers can cause tactile sensation or like feeling on the fingers. Further, for example and in one embodiment, output component(s) may include (without limitation) one or more of light sources, display devices and/or screens, audio speakers, tactile components, conductance elements, bone conducting speakers, olfactory or smell visual and/or non/visual presentation devices, haptic or touch visual and/or non-visual presentation devices, animation display devices, biometric display devices, X-ray display devices, high-resolution displays, high-dynamic range displays, multi-view displays, and head-mounted displays (HMDs) for at least one of virtual reality (VR) and augmented reality (AR), etc.

It is contemplated that embodiment are not limited to any number or type of use-case scenarios, architectural placements, or component setups; however, for the sake of brevity and clarity, illustrations and descriptions are offered and discussed throughout this document for exemplary purposes but that embodiments are not limited as such. Further, throughout this document, "user" may refer to someone having access to one or more computing devices, such as computing device 100, and may be referenced interchangeably with "person", "individual", "human", "him", "her", "child", "adult", "viewer", "player", "gamer", "developer", "programmer", and/or the like.

Throughout this document, terms like "logic", "component", "module", "framework", "engine", "tool", "circuitry", and/or the like, may be referenced interchangeably and include, by way of example, software, hardware, firmware, and/or any combination thereof. In one example, "logic" may refer to or include a software component that works with one or more of an operating system, a graphics driver, etc., of a computing device, such as computing device 100. In another example, "logic" may refer to or include a hardware component that is capable of being physically installed along with or as part of one or more system hardware elements, such as an application processor, a graphics processor, etc., of a computing device, such as computing device 100. In yet another embodiment, "logic" may refer to or include a firmware component that is capable of being part of system firmware, such as firmware of an application processor or a graphics processor, etc., of a computing device, such as controlled cavitation apparatus 100.

Further, any use of a particular brand, word, term, phrase, name, and/or acronym, such as "solder", "stretchable", "self-healing", "encapsulated", "epoxy", "semiconductor", "chip", "substrate", "metallization", "real-time", "automatic", "dynamic", "user interface", "camera", "sensor", "microphone", "display screen", "speaker", "verification", "authentication", "privacy", "user", "user profile", "user preference", "sender", "receiver", "personal device", "smart device", "mobile computer", "wearable device", "IoT device", "proximity network", "cloud network", "server computer", etc., should not be read to limit embodiments to software or devices that carry that label in products or in literature external to this document.

It is contemplated that any number and type of components may be added to and/or removed from soldering mechanism 110 and/or one or more of soldering components 120, 130 to facilitate various embodiments including adding, removing, and/or enhancing certain features. For brevity, clarity, and ease of understanding of soldering mechanism 110, many of the standard and/or known components, such as those of a computing device are not shown or discussed here. It is contemplated that embodiments, as described herein, are not limited to any technology, topology, system, architecture, and/or standard and are dynamic enough to adopt and adapt to any future changes.

FIG. 2 illustrates soldering apparatus or system 200 according to one embodiment. For brevity, many of the details already discussed with reference to FIG. 1 are not repeated or discussed hereafter. Further, for brevity and clarity, many of the well-known processes and components associated with soldering as it relates to semiconductors, etc., are not discussed in this document.

As described previously, semiconductor chips are typically attached to substrates using solder or epoxy material, where when a semiconductor chip is turned on or off, which is a normal occurrence, the semiconductor chip undergoes thermal cycling. For example, any CTE difference between the chip material (e.g., Si, SiC, GaN, GaAs, etc., ~3 to 5 ppm per degree C. per inch) and the substrate material (e.g., PCB ~17, alumina ~7, copper ~17, Aluminum ~27 ppm per degree C. per inch) leads to solder cracking or epoxy separation or delamination, where this process also initiates die cracking, starting from die edges. As aforesaid, this type of failure is common with conventional soldering techniques, where such failures include solder cracking, solder failure, solder and epoxy attachment cracking, and die cracking, all caused by thermal cycling or thermal shock in electronics or semiconductor space. These failures also limit the maximum usable size of semiconductor chips and necessitate the requirement of CTE compatibility between the chip material and the substrate material, which leads to increased manufacturing costs along.

Embodiments provide for a novel soldering technique, as facilitated by soldering system 200, to overcome any serious challenges presented by CTE incompatibilities, where this novel soldering technique offers using stretchable and self-healing solders that leverage liquid metals and epoxy encapsulants that shield and protect a stretchable solder. By developing a manufacturing process that leverages stretchable solder and stretchable epoxy-attached materials for attaching semiconductor chips to dies, the thermo-mechanical stresses on a proxy or a solder or the chip are significantly mitigated, while the failures are eliminated or minimized.

It is contemplated that although die-attached epoxy/paste solders are known in microelectronics and semiconductor industry, there are no stretchable solders for die attach applications. Embodiments provide for a novel manufacturing process leveraging stretchable solders that are designed for die applications and because these solders are fluid, they are protected by stretchable encapsulants that cover and protect the stretchable solder from flowing away. Such encapsulant materials perform two significant and different functions, such as serving as a protective barrier and shield for the solder paste and also exhibit some stretchability that can minimize or even eliminate any thermo-mechanical stresses. This stretchable solder which is to be protected by the stretchable encapsulant prevents any die warpage, and/or delamination, solder cracking caused by solder fatigue, and any die cracking caused by thermo-mechanism stresses. In one embodiment, this development of stretchable solders and pastes is achieved by employing innovative silver flake shapes, distribution and loadings, new large chain elastomeric polymers, and proprietary nano-dispersion mixing technologies, etc. This novel technique allows for a significant advantage for die attach processes with respect to microelectronics and semiconductor manufacturing where thermal and power management are of concern.

For example, as illustrated with respect to soldering system 200, semiconductor chip 201 (e.g., Si, SiC, GaN, etc.) is shown to be attached with solder balls 203 on ball grid array (BGA) chips based on tin-silver-copper or SnAgCu (SAC) alloys that are lead-free (Pb-free) alloys commonly used for electronic solders. In one embodiment, soldering system 200 further incudes stretchable, self-healing solder 205 that contains, for example, liquid-like metal, such as Gallium, combined with other materials, such as Indium, Tin, etc. As illustrated, this solder 205 is encapsulated with epoxy 207 that is used for shielding and protecting this liquid metal-based solder 205 from leaking or flowing over.

As illustrated, soldering system 200 further offers PCB (or any other substrate, such as alumina) 209 having metallization 211 (e.g., Copper (Cu)). In some embodiments, semiconductor chip 201 may or may not have solder balls 203, where it may be electrically connected to Cu metallization 211 on PCB 209. This encapsulant epoxy 207 replaces the need for any flux or underfill, while improving any mechanical and electrical properties of the soldered joint and offering stretchability. In one embodiment, this liquid metal-based solder 205 offers the necessary stretchability and self-healing to overcome any stresses typically caused by thermal cycling or other mechanical and/or electrical stresses. In another embodiment, proxy 207 is stretchable to offer similar advantages. As illustrated, solder 205 is shown as being stretched between semiconductor 201 and substrate 209, through metallization 207, based on its stretch capacity and yet it can return to its original form through self-healing without necessitating any help.

As discussed throughout this document, this novel technique for employing stretchable and self-healing solder 205, these capacities for stretching and then self-healing allows for solder joints to entirely avoid or at least overcome any solder failures that are typically associated with CTE incompatibility between the dies/chips and substrates, eliminating the root case of the majority of failures associated with microelectronics and semiconductor products.

Further, this novel technique allows for improvement in quality and long-term performance of semiconductor products and further helps with attachments of all other secondary electronic components that are exposed to thermal excursions or have to pass thermal cycling qualification testing. This also enables the use of larger semiconductor chips in the semiconductor industry, which is not possible using today's techniques due to CTE-based failures. This novel technique can lower the cost of manufacturing by a significant measure by allowing the use of regular, low cost substrates and compound materials, without having to require compounds or materials with specifically designed and engineered CTEs. For example, the novel technique can enable attachment of silicon chips to copper heatsinks instead of having to attach them to the far more expensive CuW or CuMoCu heatsinks that are also not as thermally conductive.

As illustrated, in one embodiment, solder 205 achieves its stretch and self-healing qualities or capacities by having filled with liquid-like metals, such as Gallium, combined with other metals, such as Indium and/or Tin. This allows the novel solder 205 to be stretchable and self-healing because it can quickly cover any incipient cracks through the flow of liquid metal that is contains within it. Further, this liquid metal flowing like a liquid while behaving like a metal can offer good electrical and thermal conductivity, and it is the flowability that is useful in covering cracks as soon as they are formed. Further, to prevent this liquid metal from leaking or flowing all over the place, encapsulate epoxy 203 is intelligently applied to wrap around solder 205 to shield solder 205 and prevent any of its liquid metal from leaking or flowing over. Further, as described above, in one embodiment, solder 205 is stretchable and the encapsulant acts as a flux and as an underfill, while protecting the liquid metal solder from leaking or flowing over.

It is contemplated that embodiments are not limited to any number and type of components, compounds, materials, etc. For example, the liquid-like metal of solder 205 contain any number and type of liquid metals, such as Gallium, Cesium, Rubidium, Francium, etc., and combined with any number and type of other materials, such as Indium, Tin, Bismuth, Zinc, Rhodium, Silver, etc. These liquids metals and materials are chosen for solder 205 depending on the use of solder 205, such as its application and the required melting point based on its functions and operations. These liquid metals and materials form solder 205 to allow for the capability to have sufficient amounts of flow movement to cover any incipient solder cracks as soon as they emerge, while working in conjunction with a compatible encapsulant epoxy 203 that completely wraps around solder 203, shielding and protecting solder 205 and its contents.

Further, the encapsulant epoxy 203 needs to be compatible with the liquid metal solder composition, while enhancing mechanical and electrical properties of solder 205 and offering it stretchability. Encapsulant epoxy 203 also acts as a flux and eliminates any need for fluxing, while acting as an underfill and eliminating any need for underfilling.

Moreover, this novel solder 205 can work on integrated circuit (IC) chips with or without any packages, regardless of any number and type of packages. Solder 205 can also work with various types of components that are generally soldered to a PCB or any other substrate, such as substrate 209. In addition to being compatible and defensive layer for this novel stretchable and self-healing solder 205, encapsulated epoxy 203 can also function as a flux and underfill, eliminating any need for fluxing or underfilling. Further, epoxy 203 acts as a very stretchable encapsulant to allow for added stretchability and reliability.

It is contemplated that embodiments are not limited to any number and type of semiconductor chips or electronic components or dies and that stretchable and self-healing solder 205 is useable with all different types of chip material, component material, substrate material, etc. Further, the later the CTE incompatibility between the chip material and the substrate material, the more beneficial and advantages this novel solder 205 can get. It is further contemplated that chips may contain different styles and types of solder ball materials, such as SAC, lead, etc.

Embodiments further provide for a novel technique for employing epoxy 205 that serves an encapsulant layer compatible with stretchable and self-healing solder 205 that can simultaneously work as a flux, and underfill along with being reworkable. This novel stretchable and self-healing solder 205 may also work on IC chips with or without packages or those with multiple packages, such as Package on Package (PoP), and single tier packages, such as System in Package (SiP). This solder 205 may also be cured using any number and type of curing techniques, such as thermal cure, ultra-violet (UV) cure, etc. Further, solder 205 is not limited to any number or type of applications and that it is applicable to any number and type of materials, products, systems, etc., such as microelectronics, semiconductor packaging, medical devices, plumbing, jewelry, etc., various processing methodologies, such as printed soldering, dispensed soldering, jetted soldering, laser soldering, etc. Further, graphene or other alkaline solutions or materials may be added to prevent or minimize the formation of any oxides on the copper surface.

Solder Paste

In one embodiment, solder paste for solder 205 may include a mixture of particles in a printing vehicle which is commonly referred to as a flux. The material type, percentages, shapes, and sizes of particles can determine the rheological properties like flow and viscosity of the solder paste. Generally, a flux/print vehicle is about 50% by volume and 10% by weight of the solder paste, while the rest of the paste is the metallic alloy power used in the solder paste which renders different functional characteristics to the solder paste, such as mechanical strength, electrical conductivity, thermal conductivity, and reliability. It is contemplated that merely the solder alloy power remains as permanent part of the metallurgical bond after the solder reflow, where the printing vehicle and flux components are present merely as vestigial residues.

For example: Solder Paste=Flux/Print Vehicle (approx. 50% by volume, 10% by weight)+Metallic Solder Alloy Powder (approx. 50% by volume, 90% by weight).

Now, solder paste has been manufactured for decades and used in the industry. However, embodiments provide for the following: 1) for solder alloy, using liquid metals, like Gallium, with other metals, like Iridium, Tin, Bismuth, etc., at varying percentages depending on certain functional requirements, such as one or more of melting temperate, flow characteristics, etc.; and 2) before reflowing the solder cover, protect solders, such as solder 205, with encapsulants, such as epoxy 203, to wrap around solder 205 and serve the role of a flux/print vehicle.

Figure 3A:
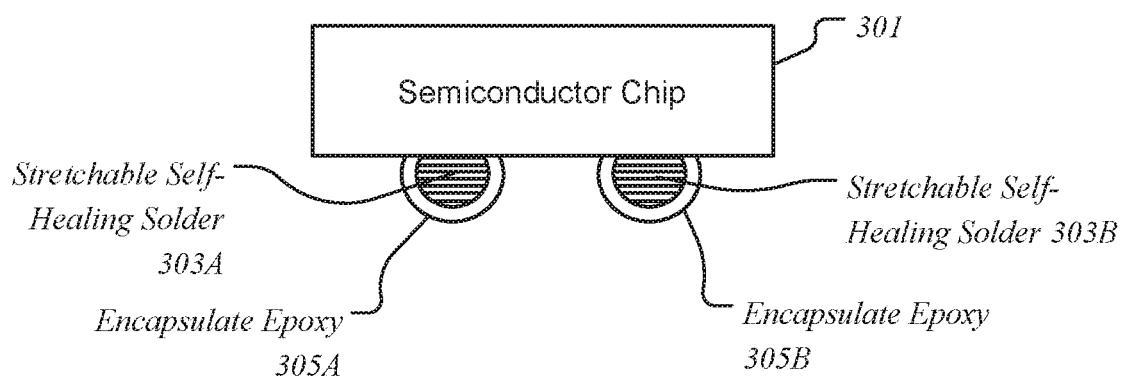
FIGS. 3A and 3B illustrates pre-reflow soldering and post-reflow soldering according to one embodiment.
Figure 3B:
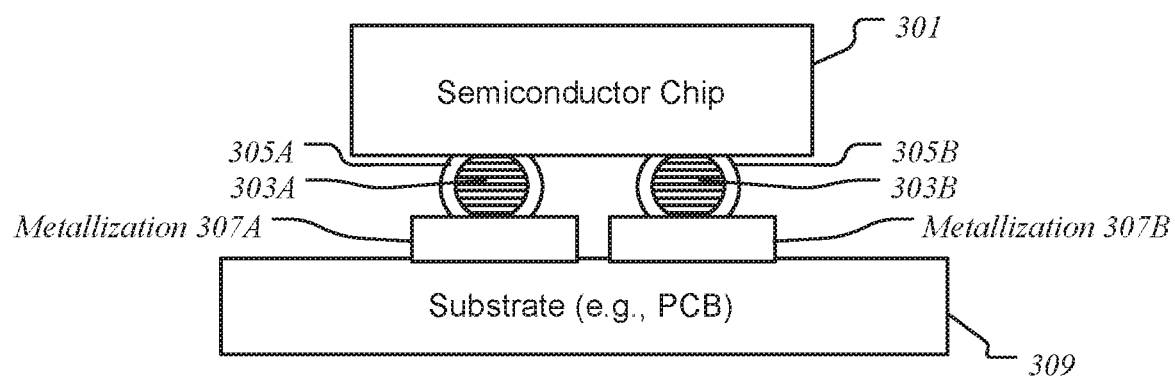

FIGS. 3A and 3B illustrates pre-reflow soldering 300 and post-reflow soldering 350, respectively, according to one embodiment. For brevity, many of the details already discussed with reference to FIGS. 1-2 are not repeated or discussed hereafter. Further, for brevity, many of the known processes and components associated with cavitation are not discussed in this document. Moreover, embodiments are not limited to any type or order of placement of components or flow of processes and thus embodiments are not limited or restricted to the illustration of FIGS. 3A-3B.

As illustrated, FIG. 3A relates to a novel technique for pre-reflow soldering 300 that involves semiconductor chip 301 that is associated with stretchable self-healing solders 303A, 303B, where these solders 303A, 303B contain liquid-like metal, such as Gallium, combined with other materials, such as Indium and Tin. Further, as illustrated, at this stage of pre-reflow soldering 300, these novel solders 303A, 303B are encapsulated with epoxies 305A, 305B that form ring-like shields around solders 303A, 303B to protect these novel liquid metal-based solders from leaking or overflowing.

FIG. 3B illustrates post-reflow technique 350, where the structure of pre-reflow technique 300 is combined with substrate 309 (e.g., PCB, alumina) through metallization (bars) 307A, 307B such that stretchable self-healing solders 303A, 303B are still protected by encapsulated epoxies 305A, 305B while working with substrate 309 through metallization 307A, 307B. As illustrated, these solders 303A, 303B are shown as stretched and yet they are protected and leak-proof and moreover, these stretched solders 303A, 303B are self-healing in that they stretch and cover any cracks when they are formed due to thermo mechanical or other stresses.

This post-reflow technique 350 of FIG. 3B is further illustrated in FIG. 2, where the illustration is zoomed-in to focus on a single stretchable self-healing solder 205 having liquid-like metal, such as Gallium, combined with other materials, such as Indium and Tin. Further, solder 205 is based on solder balls on BGA chips (e.g., SAC alloys). This novel solder 205 is surrounded and protected through encapsulate epoxy 203 that serves as a shield to protect solder 205 from leaving or overflowing any of the liquid-like metal in contains. As with FIG. 3A, FIG. 2 also illustrates solder 205 being stretched between semiconductor 201 and substrate 209, through metallization 207, based on its stretch capacity and yet it can return to its original form through self-healing without necessitating any help.

Figure 4:
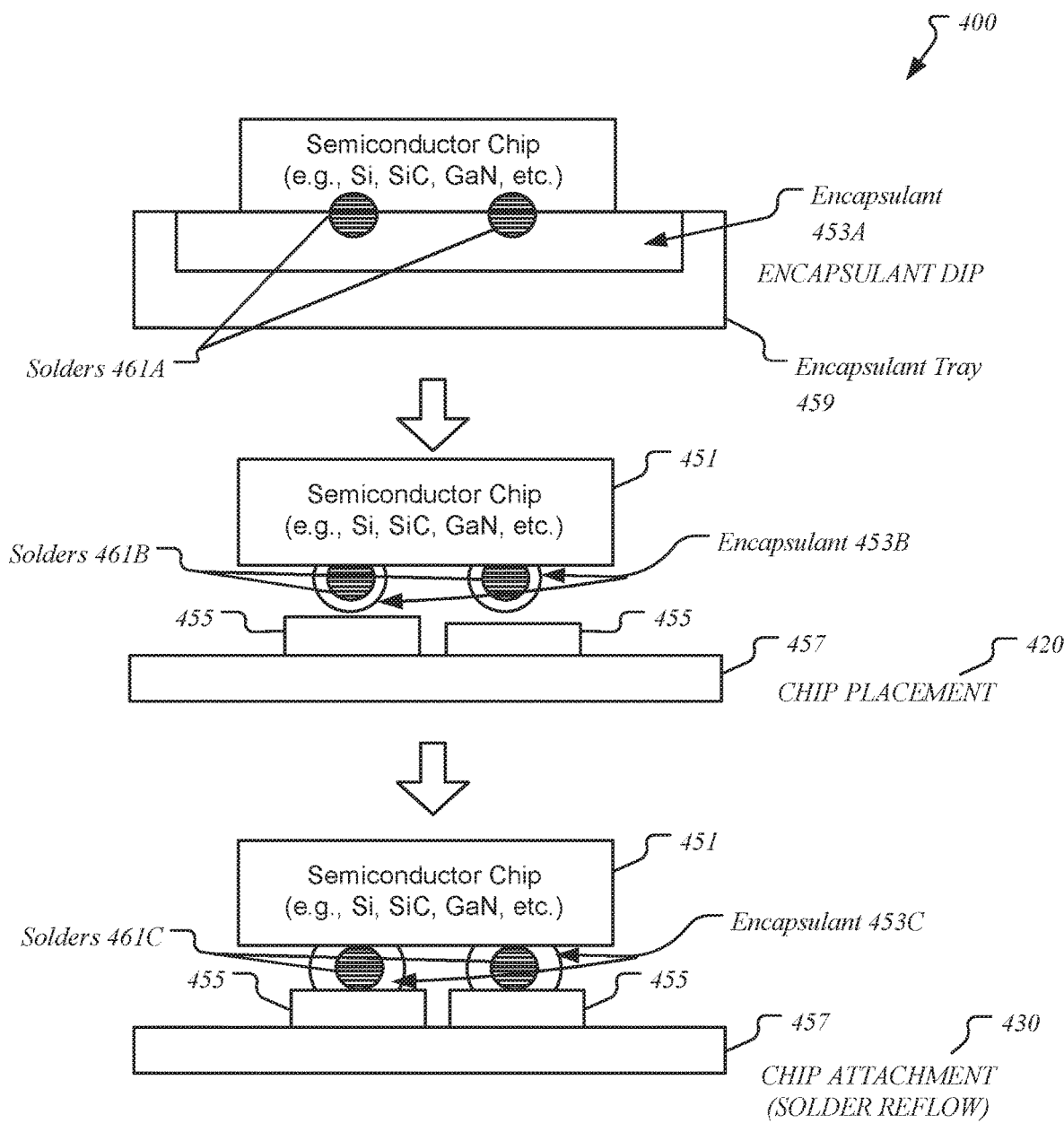
FIG. 4 illustrates a transaction sequence for employing and using stretchable and self-healing solders in microelectronics manufacturing environments according to one embodiment.

FIG. 4 illustrates a transaction sequence 400 for employing and using stretchable and self-healing solders in microelectronics manufacturing environments according to one embodiment. For brevity, many of the details previously discussed with reference to FIGS. 1-3B may not be discussed or repeated hereafter. Further, for brevity, many of the known processes and components associated with cavitation processes and apparatus are not discussed in this document. Any processes relating to this transaction sequence 400 may be performed by processing logic that may comprise hardware (e.g., circuitry, dedicated logic, programmable logic, etc.), software (such as instructions run on a processing device), or a combination thereof, as facilitated by soldering system 200 of FIG. 2 and/or soldering mechanism 110 and/or one or more of soldering components 120, 130 of FIG. 1. The processes associated with this transaction sequence 400 may be illustrated or recited in linear sequences for brevity and clarity in presentation; however, it is contemplated that any number of them can be performed in parallel, asynchronously, or in different orders.

As described in detail with respect to FIGS. 2 and 3A-3B, transaction sequence begins at the stage of encapsulant dip 410 where the solder material (e.g., liquid metal, etc.), shown in the shape of two solders 461A, is dipped in encapsulant 453A, where solders 461A are further shown as associated with semiconductor chip 451. As described earlier, this dipping in encapsulant 453A is done in such a manner that two solders 461A could be fully covered with or wrapped in encapsulant (epoxy) 453B at the next stage of chip placement 420.

As illustrated, now with encapsulant 453B, two solders 461B are fully protected and sealed from any leaks or flowing over of the liquid material that these solders 461B. In one embodiment, this liquid material contained within and the protection offered by encapsulant 453B that allows solders 461B to be flexible, stretchable, and self-healing as previously discussed. At chip placement 420, semiconductor chip 451 is prepared for placement on substrate 457 through metallization 455.

At chip attached (solder reflow) 430, semiconductor chip 451 is placed on and attached to substrate 457 through metallization 455 and solders 461C covered in encapsulant 453B. Here, as illustrated, solders 461C are stretched between chip 451 and substrate 457 and yet solders 461C show flexibility and stretchability, along with resilience against any leaks or overflows due to the protection offered by encapsulants 453C serving as shields to solders 461C.

Figure 5:
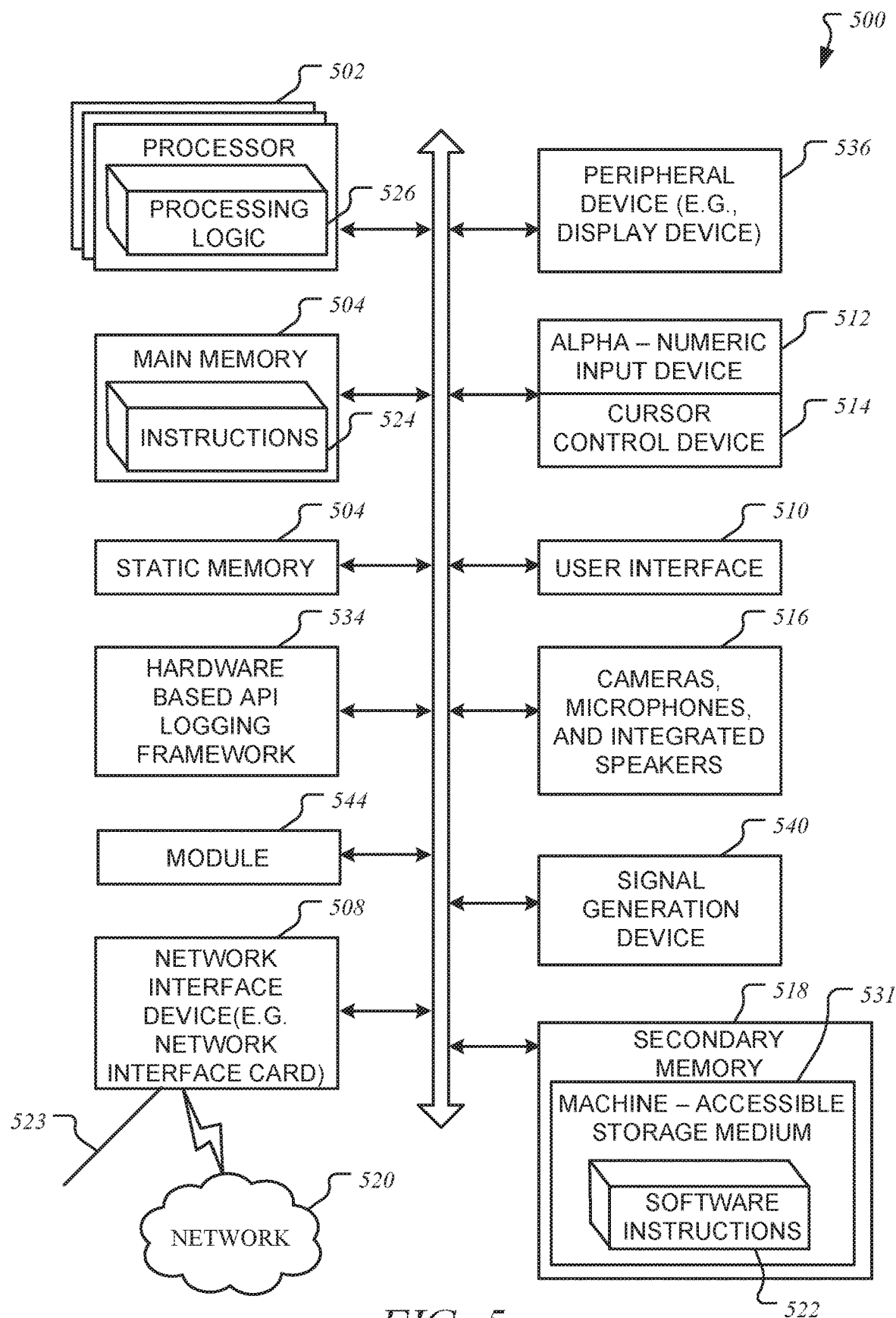
FIG. 5 illustrates an embodiment of an exemplary computing architecture that may be suitable for implementing various embodiments in accordance with some examples.

FIG. 5 illustrates a diagrammatic representation of a machine 500 in the exemplary form of a computer system, in accordance with one embodiment, within which a set of instructions, for causing machine 500 to perform any one or more of the methodologies discussed herein, may be executed. Machine 500 may be the same as or similar to or contained within or include printing apparatus 100 of FIG. 1 to perform or execute one or more methodologies discussed throughout this document. In alternative embodiments, machine 500 may be connected (e.g., networked) to other machines either directly, such as via media slot or over a network, such as a cloud-based network, a Local Area Network (LAN), a Wide Area Network (WAN), a Metropolitan Area Network (MAN), a Personal Area Network (PAN), an intranet, an extranet, or the Internet. The machine may operate in the capacity of a server or a client machine in a client-server network environment, or as a peer machine in a peer-to-peer (or distributed) network environment or as a server or series of servers within an on-demand service environment, including an on-demand environment providing multi-tenant database storage services. Certain embodiments of the machine may be in the form of a personal computer (PC), a tablet PC, a set-top box (STB), a Personal Digital Assistant (PDA), a cellular telephone, a web appliance, a server, a network router, switch or bridge, computing system, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes one or more processors 502, a main memory 504 (e.g., read-only memory (ROM), flash memory, dynamic random access memory (DRAM) such as synchronous DRAM (SDRAM) or Rambus DRAM (RDRAM), etc., static memory 542, such as flash memory, static random access memory (SRAM), volatile but high-data rate RAM, etc.), and a secondary memory 518 (e.g., a persistent storage device including hard disk drives and persistent multi-tenant data base implementations), which communicate with each other via a bus 530. Main memory 504 includes instructions 524 (such as software 522 on which is stored one or more sets of instructions 524 embodying any one or more of the methodologies or functions of material mechanism 110 of computing device 100 of FIG. 1 and other figures described herein) which operate in conjunction with processing logic 526 and processor 502 to perform the methodologies discussed herein.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations and functionality of material mechanism 110 of computing device 100 of FIG. 1 and other figures discussed herein.

The computer system 500 may further include a network interface device 508, such as a network interface card (NIC). The computer system 500 also may include a user interface 510 (such as a video display unit, a liquid crystal display (LCD), or a cathode ray tube (CRT)), an alphanumeric input device 512 (e.g., a keyboard), a cursor control device 514 (e.g., a mouse), a signal generation device 540 (e.g., an integrated speaker), and other devices 516 like cameras, microphones, integrated speakers, etc. The computer system 500 may further include peripheral device 536 (e.g., wireless or wired communication devices, memory devices, storage devices, audio processing devices, video processing devices, display devices, etc.). The computer system 500 may further include a hardware-based application programming interface logging framework 534 capable of executing incoming requests for services and emitting execution data responsive to the fulfillment of such incoming requests.

Network interface device 508 may also include, for example, a wired network interface to communicate with remote devices via network cable 523, which may be, for example, an Ethernet cable, a coaxial cable, a fiber optic cable, a serial cable, a parallel cable, etc. Network interface device 508 may provide access to a LAN, for example, by conforming to IEEE 802.11b and/or IEEE 802.11g standards, and/or the wireless network interface may provide access to a personal area network, for example, by conforming to Bluetooth standards. Other wireless network interfaces and/or protocols, including previous and subsequent versions of the standards, may also be supported. In addition to, or instead of, communication via the wireless LAN standards, network interface device 508 may provide wireless communication using, for example, Time Division, Multiple Access (TDMA) protocols, Global Systems for Mobile Communications (GSM) protocols, Code Division, Multiple Access (CDMA) protocols, and/or any other type of wireless communications protocols.

The secondary memory 518 may include a machine-readable storage medium (or more specifically a machine-accessible storage medium) 531 on which is stored one or more sets of instructions (e.g., software 522) embodying any one or more of the methodologies or functions of material mechanism 110 of FIG. 1 and other figures described herein. The software 522 may also reside, completely or at least partially, within the main memory 504, such as instructions 524, and/or within the processor 502 during execution thereof by the computer system 500, the main memory 504 and the processor 502 also constituting machine-readable storage media. The software 522 may further be transmitted or received over network 520 via the network interface card 508. The machine-readable storage medium 531 may include transitory or non-transitory machine-readable storage media.

Portions of various embodiments may be provided as a computer program product, which may include a computer-readable medium having stored thereon computer program instructions, which may be used to program a computer (or other electronic devices) to perform a process according to the embodiments. The machine-readable medium may include, but is not limited to, floppy diskettes, optical disks, compact disk read-only memory (CD-ROM), and magneto-optical disks, ROM, RAM, erasable programmable read-only memory (EPROM), electrically EPROM (EEPROM), magnet or optical cards, flash memory, or other type of media/machine-readable medium suitable for storing electronic instructions.

Modules 544 relating to and/or include components and other features described herein (for example in relation to material mechanism 110 of computing device 100 as described with reference to FIG. 1) can be implemented as discrete hardware components or integrated in the functionality of hardware components such as ASICS, FPGAs, DSPs or similar devices. In addition, modules 544 can be implemented as firmware or functional circuitry within hardware devices. Further, modules 544 can be implemented in any combination hardware devices and software components.

The techniques shown in the figures can be implemented using code and data stored and executed on one or more electronic devices (e.g., an end station, a network element). Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable transmission media (e.g., electrical, optical, acoustical or other form of propagated signals—such as carrier waves, infrared signals, digital signals). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). Thus, the storage device of a given electronic device typically stores code and/or data for execution on the set of one or more processors of that electronic device. Of course, one or more parts of an embodiment may be implemented using different combinations of software, firmware, and/or hardware.

Any of the above embodiments may be used alone or together with one another in any combination. Embodiments encompassed within this specification may also include embodiments that are only partially mentioned or alluded to or are not mentioned or alluded to at all in this brief summary or in the abstract. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive.

What is claimed is:

1. A microelectronics manufacturing apparatus comprising:
  one or more solders associated with a microelectronics component, wherein the one or more solders include a liquid metal and are wrapped in an encapsulation epoxy, wherein the liquid metal comprises one or more of Gallium, Cesium, Rubidium, or Francium, wherein the one or more solders further include a solder material combined with the liquid metal, and wherein the solder material includes one or more of Indium, Tin, Bismuth, Zinc, Rhodium, or Silver; and
  a substrate coupled to the one or more solders.

2. The apparatus of claim 1, wherein the one or more solders are stretchable and self-healing such that the liquid metal offers stretchability and self-healing to the one or more solders.

3. The apparatus of claim 1, wherein the encapsulation epoxy provides protection against potential leaks or overflows of the liquid metal from the one or more solders.

4. The apparatus of claim 1, wherein the substrate comprises an FR4 based printed circuit board (PCB) substrate, wherein the substrate to have metallization to engage with the one or solders wrapped in the encapsulation epoxy, wherein the metallization is based on Copper.

5. The apparatus of claim 1, wherein the microelectronics component comprises a semiconductor chip including an integrated circuit representing a set of electronic circuits on a board or a chip made of a semiconductor material including silicon.

* * * * *